United States Patent
Peng (10) Patent No.: US 12,494,786 B2
(45) Date of Patent: Dec. 9, 2025

(54) LOGIC CIRCUIT AND FRONT END MODULE INCLUDING THE SAME

(71) Applicant: RichWave Technology Corp., Taipei (TW)

(72) Inventor: Shao-Wei Peng, Taipei (TW)

(73) Assignee: RichWave Technology Corp., Taipei (TW)

( * ) Notice: Subject to any disclaimer, the term of this patent is extended or adjusted under 35 U.S.C. 154(b) by 118 days.

(21) Appl. No.: 18/540,935

(22) Filed: Dec. 15, 2023

(65) Prior Publication Data
US 2025/0183894 A1 Jun. 5, 2025

(30) Foreign Application Priority Data
Dec. 1, 2023 (TW) ................................. 112146730

(51) Int. Cl.
*H03K 19/0175* (2006.01)
*H03K 19/00* (2006.01)

(52) U.S. Cl.
CPC . *H03K 19/017545* (2013.01); *H03K 19/0021* (2013.01)

(58) Field of Classification Search
CPC ................... H03K 19/017545; H03K 19/0021
See application file for complete search history.

(56) References Cited

U.S. PATENT DOCUMENTS

| 3,969,633 | A | * | 7/1976 | Paluck | ............. H03K 19/09425 |
| | | | | | 326/60 |
| 2022/0166428 | A1 | | 5/2022 | Shigesawa | |
| 2023/0187440 | A1 | | 6/2023 | Chern | |

FOREIGN PATENT DOCUMENTS

| CN | 209462359 | U | 10/2019 | |
| CN | 108735163 | B | 11/2020 | |
| CN | 216490435 | U | 5/2022 | |
| EP | 1009097 | A1 * | 6/2000 | ............. H03K 19/00 |
| TW | 202023195 | A | 6/2020 | |

OTHER PUBLICATIONS

Office action mailed on Aug. 27, 2024 for the Taiwan application No. 112146730, filing date Dec. 1, 2023, pp. 1-5. ,Aug. 27, 2024.

* cited by examiner

*Primary Examiner* — Daniel D Chang
(74) *Attorney, Agent, or Firm* — Winston Hsu (57) ABSTRACT

A logic circuit includes an input terminal for receiving an input signal, a first output terminal for outputting a first output signal, a second output terminal for outputting a second output signal, and three inverting circuits. A first inverting circuit is coupled between the input terminal and the first output terminal and includes a first depletion mode transistor. The first depletion mode transistor includes a second terminal coupled to a first node. A second inverting circuit is coupled between the first inverting circuit and the first output terminal and includes a second depletion mode transistor. The second depletion mode transistor includes a second terminal coupled to a second node. A third inverting circuit is coupled between the input terminal and the second output terminal. A first node voltage at the first node is lower than a second node voltage at the second node.

22 Claims, 5 Drawing Sheets

LOGIC CIRCUIT AND FRONT END MODULE INCLUDING THE SAME

TECHNICAL FIELD

The present invention relates to a logic circuit, and more specifically, to a logic circuit implemented by depletion mode transistors and controlled by positive control voltages. The present invention is additionally related to a front end module including the logic circuit.

BACKGROUND

An inverter (interchangeably, inverter circuit) is a logic circuit that realizes logic NOT (interchangeably, logical negation). A conventional inverter can be implemented by an enhancement mode transistor and/or a depletion mode transistor. In general, an inverter may be used with other components, such as switch modules. In an embodiment where a switch module is implemented by depletion mode transistors, an inverter may also be preferably implemented by depletion mode transistors. However, conventionally, a depletion mode transistor may be operated by using a negative control voltage, which leads to inconvenience of control.

SUMMARY

According to an embodiment of the invention, a logic circuit may include an input terminal, a first output terminal, a second output terminal, a first inverting circuit, a second inverting circuit, and a third inverting circuit. The input terminal is configured to receive an input signal. The first output terminal is configured to output a first output signal. The second output terminal is configured to output a second output signal. The first inverting circuit may be coupled between the input terminal and the first output terminal and may include a first depletion mode transistor. The second inverting circuit may be coupled between the first inverting circuit and the first output terminal, and may include a second depletion mode transistor. The third inverting circuit may be coupled between the input terminal and the second output terminal. The first depletion mode transistor may include a first terminal, a second terminal coupled to a first node, and a control terminal coupled to the input terminal. The second depletion mode transistor may include a first terminal coupled to the first output terminal, a second terminal coupled to a second node, and a control terminal coupled to the first depletion mode transistor. A first node voltage at the first node is lower than a second node voltage at the second node.

According to another embodiment of the invention, a front end module may include a logic circuit, a first switch, and a second switch. The logic circuit may include an input terminal, a first output terminal, a second output terminal, a first inverting circuit coupled between the input terminal and the first output terminal, a second inverting circuit coupled between the first inverting circuit and the first output terminal, and a third inverting circuit coupled between the input terminal and the second output terminal. The first inverting circuit may include a first depletion mode transistor. The first depletion mode transistor may include a first terminal, a second terminal coupled to a first node, and a control terminal coupled to the input terminal. The second inverting circuit may include a second depletion mode transistor. The second depletion mode transistor may include a first terminal coupled to the first output terminal, a second terminal coupled to a second node, and a control terminal coupled to the first terminal of the first depletion mode transistor. A first node voltage of the first node is lower than a second node voltage of the second node. The first switch may be coupled to the first output terminal of the logic circuit, and is turned on or turned off according to the first output signal. The second switch may be coupled to the second output terminal of the logic circuit, and is turned on or turned off according to the second output signal.

According to a further embodiment of the present invention, a logic circuit may include an input terminal, a first output terminal, a second output terminal, a first inverting circuit, a second inverting circuit, a third inverting circuit, and a bias circuit. The input terminal is configured to receive an input signal. The first output terminal is configured to output a first output signal. The second output terminal is configured to output a second output signal. The first inverting circuit may be coupled between the input terminal and the first output terminal. The second inverting circuit may be coupled between the first inverting circuit and the first output terminal, and may include a second depletion mode transistor. The third inverting circuit may be coupled between the input terminal and the second output terminal, and may include a third depletion mode transistor. The second depletion mode transistor may include a first terminal coupled to the first output terminal, a second terminal coupled to a node, and a control terminal coupled to the first inverting circuit. The third depletion mode transistor may include a first terminal coupled to the second output terminal, a second terminal coupled to the node, and a control terminal coupled to the input terminal. The bias circuit may be coupled between a reference voltage terminal and the node, and is configured to provide a node voltage at the node.

DETAILED DESCRIPTION

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figure 1:
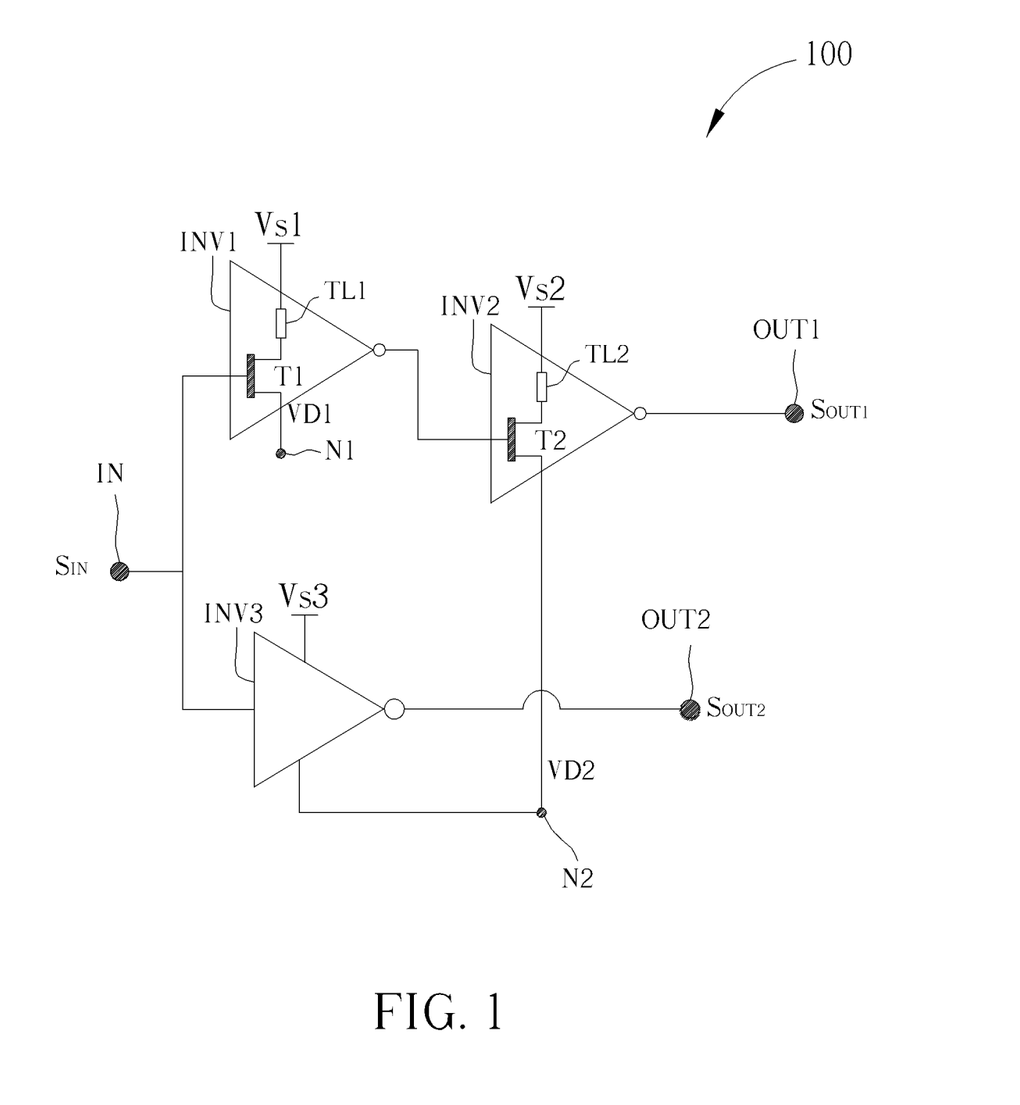
FIGS. 1 to 3 are schematic diagrams of logic circuits according to various embodiments of the present invention.

FIG. 1 is a schematic diagram of a logic circuit 100 according to an embodiment of the present invention. The logic circuit 100 may include an input terminal IN, a first output terminal OUT1, a second output terminal OUT2, a first inverting circuit INV1, a second inverting circuit INV2, and a third inverting circuit INV3. In some embodiments, the input terminal IN may be configured to receive an input signal $S_{IN}$, and the input signal $S_{IN}$ may be converted by the logic circuit 100, so that a first output signal $S_{OUT1}$ may be output at the first output terminal OUT1, and/or a second output signal $S_{OUT2}$ may be output at the second output terminal OUT2. For example, the first output signal $S_{OUT1}$ may have an identical phase as the input signal $S_{IN}$, While the phase of the second output signal $S_{OUT2}$ may be reversed with respect to that of the input signal $S_{IN}$. Further, the first output signal $S_{OUT1}$ and the second output signal $S_{OUT2}$ may have the same voltage level.

In some embodiments, the first inverting circuit INV1 may be coupled between the input terminal IN and the second inverting circuit INV2, and may include a first depletion mode transistor T1. Specifically, the first depletion mode transistor T1 may include a first terminal, a second terminal, and a control terminal. The second terminal may be coupled to a first node N1 and the control terminal may be coupled to the input terminal IN. The second inverting circuit INV2 may be coupled between the first inverting circuit INV1 and the first output terminal OUT1, and may include a second depletion mode transistor T2. Specifically, the second depletion mode transistor T2 may include a first terminal, a second terminal and a control terminal. The first terminal may be coupled to the first output terminal OUT1, the second terminal may be coupled to a second node N2, and the control terminal may be coupled to the first inverting circuit INV1, specifically, to the first terminal of the first depletion mode transistor T1 in the first inverting circuit INV1. The third inverting circuit INV3 may be coupled between the input terminal IN and the second output terminal OUT2. In some embodiments, a first node voltage VD1 may be provided at the first node N1, and a second node voltage VD2 may be provided at the second node N2. The first node voltage VD1 may be lower than the second node voltage VD2 (i.e., VD1<VD2).

In the above configurations, the first depletion mode transistor T1 and/or the second depletion mode transistor T2 may be implemented by, for example, a field effect transistor (FET) or a bipolar junction transistor (BJT). As for FET, the first terminal of such a transistor may be a drain, the second terminal may be a source and the control terminal may be a gate. As for BJT, the first terminal of such a transistor may be a collector, the second terminal may be an emitter and the control terminal may be a base.

Figure 2:
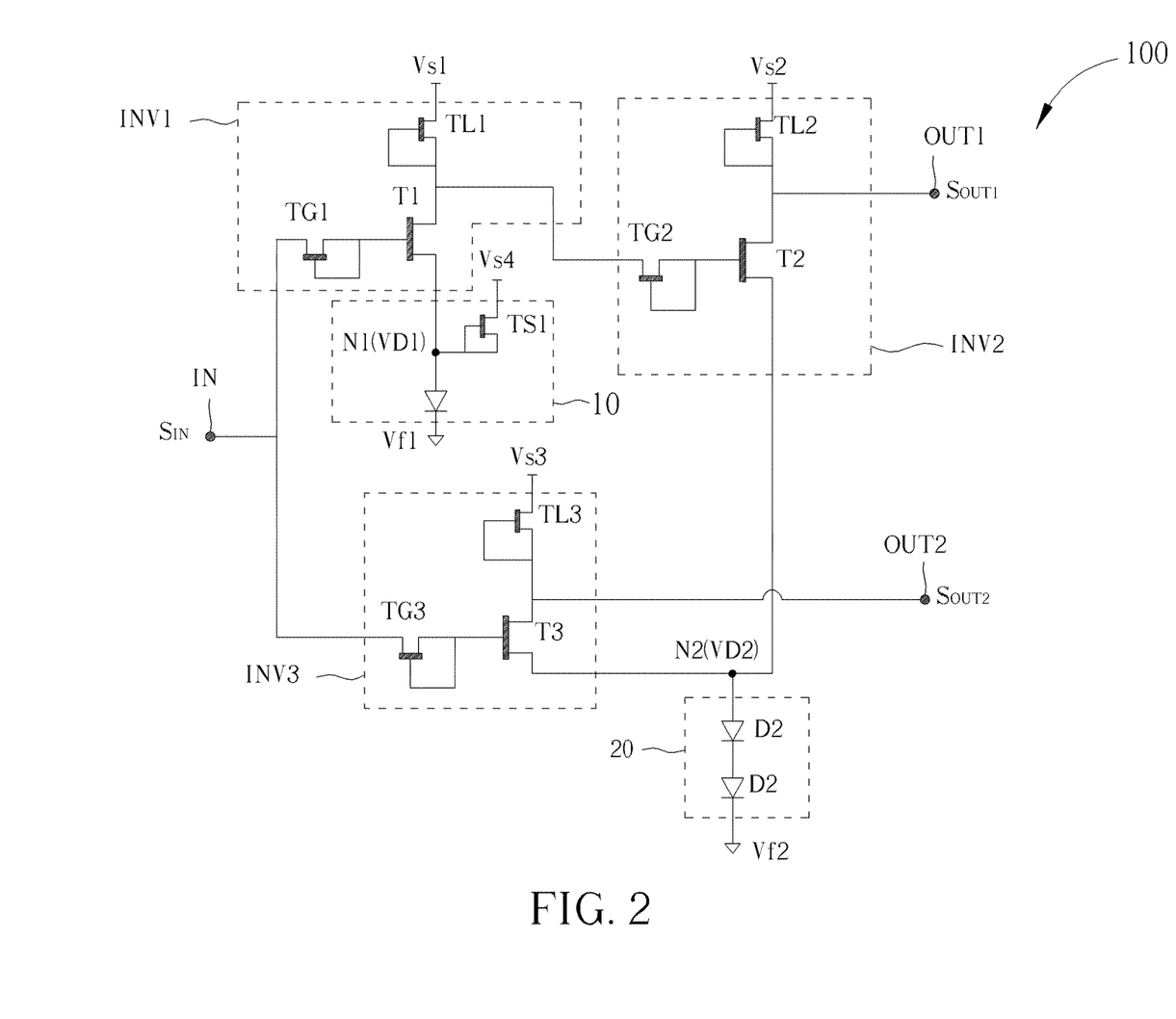

FIG. 2 is a schematic diagram of a logic circuit 100 according to a further embodiment of the present invention. The first inverting circuit INV1, second inverting circuit INV2 and the third inverting circuit INV3 shown in FIG. 2 may be examples of inverting circuits INV1~INV3 respectively illustrated in FIG. 1.

Specifically, the first inverting circuit INV1 may include a first current limiting transistor TG1, a first load transistor TL1, and a first depletion mode transistor T1 described above. The first current limiting transistor TG1 may include a first terminal, a second terminal and a control terminal. The first terminal may be coupled to the input terminal IN of the logic circuit 100. The second terminal and the control terminal may be coupled together and further coupled to the control terminal of the first depletion mode transistor T1. A first terminal of the first depletion mode transistor T1 may be coupled to the first load transistor TL1, a second terminal of the first depletion mode transistor T1 may be coupled to the first node N1, and a control terminal of the first depletion mode transistor T1 may be coupled to the second terminal of the first current limiting transistor TG1. The first load transistor TL1 may include a first terminal, a second terminal, and a control terminal. Further, the first terminal may be configured to receive a first system voltage Vs1. The second terminal and the control terminal may be coupled together and further coupled to the first terminal of the first depletion mode transistor T1. That is, the first terminal of the first depletion mode transistor T1 may be configured to receive the first system voltage Vs1 via the first load transistor TL1, and the control terminal of the first depletion mode transistor T1 may be coupled to the input terminal IN of the logic circuit 100 via the first current limiting transistor TG1. In the above embodiment, the first terminal of the first depletion mode transistor T1 may be implemented as an output terminal of the first inverting circuit INV1.

In some embodiments, the first current limiting transistor TG1 and/or the first load transistor TL1 may be depletion mode transistors.

In some embodiments, the first current limiting transistor TG1 may be coupled to the control terminal of the first depletion mode transistor T1 to function as a current regulator, so as to avoid excessive current when the first depletion mode transistor T1 is forward biased. The first load transistor TL1 may be coupled to the first terminal of the first depletion mode transistor T1 to function as a load for the first inverting circuit INV1.

In the embodiment shown in FIG. 2, the logic circuit 100 may further include a first bias circuit 10 disposed between a first reference voltage terminal Vf1 and the first node N1. The first bias circuit 10 may be configured to provide a first node voltage VD1 at the first node N1.

For example, the first bias circuit 10 may include m first diodes coupled in series, and m is a positive integer (e.g., there may be one or more first diodes D1). As shown, the first diode D1 may include an anode coupled to the first node N1, and a cathode coupled to the first reference voltage terminal Vf1. In some embodiments, by providing at least one first diode D1 and forward biasing the at least one first diodes D1, a first node voltage VD1 may be provided at the first node N1. For example, the first reference voltage terminal Vf1 may be a ground terminal, and a first diode D1 may have a voltage drop of about 0.75V when forward biased. Therefore, two first diodes D1, for example, may be disposed and forward biased, so as to provide a first node voltage VD1 of about 1.5V at the first node N1. However, the present invention is not such limited, and in other embodiments, different number and/or type of the first diodes may be provided, so as to achieve a desired first node voltage VD1. For example, more than two first diodes D1 may be disposed to provide a higher first node voltage VD1.

In some embodiments, the first diode D1 may be implemented by a PN diode or a Schottky diode. In the above embodiment, the first bias circuit 10 may include a diode. However, the present disclosure is not such limited. In other embodiments, the first bias circuit 10 may be alternatively or additionally implemented by other components, such as a resistor, or a combination of a diode and a resistor, so as to provide the first node voltage VD1 at the first node N1.

Referring to FIG. 2, in some embodiments, the first depletion mode transistor T1 may have a first threshold voltage VP1, such as a pinch off voltage with a negative value. Specifically, as for the first depletion mode transistor T1, when a difference between a voltage VG1 at the control terminal and a voltage at the second terminal (e.g., the first node voltage VD1 shown in FIG. 2), for example, the result of the voltage VG1 at the control terminal minus the first node voltage VD1, is larger than the first threshold voltage VP1, the first depletion mode transistor T1 may be turned on, such that a first low voltage VL1 may be output at the first terminal of the first depletion mode transistor T1. That is, the first inverting circuit INV1 may output the first low voltage VL1. When the difference between the voltage VG1 at the control terminal and the voltage at the second terminal (e.g., the first node voltage VD1 shown in FIG. 2) is smaller than or equal to the first threshold voltage VP1, the first depletion mode transistor T1 may be turned off, such that a first high voltage VH1 may be output at the first terminal of the first depletion mode transistor T1. That is, the first inverting circuit INV1 may output the first high voltage VH1. In the above embodiment, the first high voltage VH1 may be higher than the first low voltage VL1.

Specifically, when the first depletion mode transistor T1 is turned off, the first high voltage VH1 may be associated with (e.g., substantially equal to) the first system voltage Vs1. When the first depletion mode transistor T1 is turned on, the first low voltage VL1 may be associated with (e.g., substantially equal to) the first node voltage VD1.

In other words, if VG1−VD1>VP1 (i.e., VG1>VD1+VP1), the first depletion mode transistor T1 may be turned on. If VG1−VD1≤VP1 (i.e., VG1≤VD1+VP1), the first depletion mode transistor T1 may be turned off. Therefore, as for the voltage VG1 at the control terminal of the first depletion mode transistor T1, a first threshold value may be defined as VTH1=VD1+VP1. In some embodiments, the first node voltage VD1 may be a positive voltage, and the first threshold voltage VP1 may be a negative voltage. Further, the absolute value of the first node voltage VD1 may be configured to be greater than the absolute value of the first threshold voltage VP1 (i.e., |VD1|>|VP1|), and the aforementioned first threshold value VTH1=VD1+VP1 may be a positive value. For example, the first node voltage VD1 may be about 1.5V, the first threshold voltage VP1 for the first depletion mode transistor T1 may be about −0.8V, and the first threshold value VTH1=VD1+VP1 for the voltage VG1 at the control terminal of the first depletion mode transistor T1 may be a positive value of about 0.7V.

In some embodiments, as shown in FIG. 2, the voltage VG1 at the control terminal of the first depletion mode transistor T1 may be associated with the voltage of the input signal $S_{IN}$, for example, may substantially equal to the voltage $V_{IN}$ of the input signal $S_{IN}$. In such a case, the voltage $V_{IN}$ of the input signal $S_{IN}$ may substantially have a threshold value VTH1=VD1+VP1.

In the embodiment shown in FIG. 2, the second inverting circuit INV2 may include a second current limiting transistor TG2, a second load transistor TL2, and the aforementioned second depletion mode transistor T2. The arrangement and purpose of the second current limiting transistor TG2 and/or the second load transistor TL2 in the second inverting circuit INV2 may be similar to those of the first current limiting transistor TG1 and/or the first load transistor TL1 in the first inverting circuit INV1, respectively, and thus may not discussed in detail. Nevertheless, the differences may be described as below.

The first terminal of the second current limiting transistor TG2 may be coupled to the output terminal of the first inverting circuit INV1 (i.e., the first terminal of the first depletion mode transistor T1). Thus, the control terminal of the second depletion mode transistor T2 may be coupled to an output terminal of the first inverting circuit INV1 via the second current limiting transistor TG2, so as to receive an output signal of the first inverting circuit INV1. The first terminal of the second load transistor TL2 may be configured to receive a second system voltage Vs2, such that the first terminal of the second depletion mode transistor T2 may receive the second system voltage Vs2 via the second load transistor TL2. In the above embodiment, the first terminal of the second depletion mode transistor T2 may be implemented as an output terminal of the second inverting circuit INV2, and the output terminal of the second inverting circuit INV2 may be further coupled to the first output terminal OUT1 of the logic circuit 100.

In some embodiments, the second current limiting transistor TG2 and/or the second load transistor TL2 may be depletion mode transistors.

In the embodiment shown in FIG. 2, the logic circuit 100 may further include a second bias circuit 20 disposed between the second reference voltage terminal Vf2 and the second node N2, and configured to provide a second node voltage VD2 at the second node N2.

For example, the second bias circuit 20 may include n second diodes coupled in series, and n is a positive integer (e.g., there may be one or more second diodes D2). As shown, the second diode D2 may include an anode coupled to the second node N2, and a cathode coupled to the second reference voltage terminal Vf2. In some embodiments, by providing at least one second diode D2 and forward biasing the at least one second diodes D2, a second node voltage VD2 may be provided at the second node N2. For example, the second reference voltage terminal Vf2 may be a ground terminal, and a second diode D2 may have a voltage drop of about 0.75V when forward biased. Therefore, four second diodes D2, for example, may be disposed and forward biased, so as to provide a second node voltage VD2 of about 3V at the second node N2. However, the present invention is not such limited, and in other embodiments, different number and/or type of the second diodes may be provided, so as to achieve a desired second node voltage VD2.

In some embodiments, similar to that of the first bias circuit 10, the second diode D2 of the second bias circuit 20 may be implemented by a PN diode or a Schottky diode. In other embodiments, the second bias circuit 20 may alternatively or additionally implemented by other components, such as a resistor or a combination of a diode and a resistor.

In the above embodiment, the first bias circuit 10 may include m first diodes coupled in series, the second bias circuit 20 may include n second diodes D2 coupled in series, and quantity of the second diode D2 may be greater than that of the first diode D1 (i.e., n may be greater than m). In a case where the first bias circuit 10 and the second bias circuit 20 both utilize a same type of diode, the second node voltage VD2 provided by the second bias circuit 20 may be higher than the first node voltage VD1 provided by the first bias circuit 10. For example, n may be twice of m (i.e., n=2*m), such that VD2 may be twice of VD1, i.e., VD2=2*VD1. For purpose of description, FIG. 2 shows an embodiment where m=1 and n=2. However, the present invention is not such limited, and in other embodiments, m may be 2, and n may be 4.

In some embodiments, similar to the first depletion mode transistor T1, the second depletion mode transistor T2 may have a second threshold voltage VP2, such as a pinch off voltage with a negative value. Specifically, as for the second depletion mode transistor T2, when a difference between a voltage VG2 at the control terminal and a voltage at the second terminal (e.g., the second node voltage VD2 shown in FIG. 2), for example, the result of the voltage VG2 at the control terminal minus the second node voltage VD2, is larger than the second threshold voltage VP2, the second depletion mode transistor T2 may be turned on, such that a second low voltage VL2 may be output at the first terminal of the second depletion mode transistor T2. That is, the second inverting circuit INV2 may output the second low voltage VL2. When the difference between the voltage VG2 at the control terminal and the voltage at the second terminal (e.g., the second node voltage VD2 shown in FIG. 2) is smaller than or equal to the second threshold voltage VP2, the second depletion mode transistor T2 may be turned off, such that a second high voltage VH2 may be output at the first terminal of the second depletion mode transistor T2. That is, the second inverting circuit INV2 may output the second high voltage VH2. In the above embodiment, the second high voltage VH2 may be higher than the second low voltage VL2.

Specifically, when the second depletion mode transistor T2 is turned off, the second high voltage VH2 may be associated with (e.g., substantially equal to) the second system voltage Vs2. When the second depletion mode transistor T2 is turned on, the second low voltage VL2 may be associated with (e.g., substantially equal to) the second node voltage VD2.

In other words, if VG2−VD2>VP2 (i.e., VG2>VD2+VP2), the second depletion mode transistor T2 may be turned on. If VG2−VD2≤VP2 (i.e., VG2≤VD2+VP2), the second transistor T2 may be turned off. Therefore, as for the voltage VG2 at the control terminal of the second depletion mode transistor T2, a second threshold value may be defined as VTH2=VD2+VP2. In some embodiments, the second node voltage VD2 may be a positive voltage, and the second threshold voltage VP2 may be a negative voltage. Further, the absolute value of the second node voltage VD2 may be configured to be greater than the absolute value of the second threshold voltage VP2 (i.e., |VD2|>|VP2|), and the aforementioned second threshold value VTH2=VD2+VP2 may be a positive value. For example, the second node voltage VD2 may be twice of the first node voltage VD1 (i.e., VD2=2*VD1), and the first node voltage VD1 may be about 1.5V. Thus, the second node voltage VD2 may be about 3V. The second threshold voltage VP2 for the second depletion mode transistor T2 may be about −0.8V, and thus the second threshold value VTH2=VD2+VP2 for the voltage VG2 at the control terminal of the second depletion mode transistor T2 may be a positive value of about 2.2V.

In some embodiments, the voltage VG2 at the control terminal of the second depletion mode transistor T2 may be associated with (e.g., substantially equal to) the voltage of an output signal of the first inverting circuit INV1. In this case, the voltage of the output signal of the first inverting circuit INV1 may substantially have a threshold value VTH2=VD2+VP2.

In some embodiments, as described above, the first inverting circuit INV1 may output the first low voltage VL1 or the first high voltage VH1. When the first inverting circuit INV1 outputs the first low voltage VL1, the first low voltage VL1 may substantially equal to the first node voltage VD1. By configuring the first node voltage VD1 to be lower or equal to the second threshold value VTH2=VD2+VP2 (i.e., VD1≤VTH2 (VTH2=VD2+VP2)), the second depletion mode transistor T2 may be turned off, such that the second high voltage VH2 may be output at the first terminal of the second depletion mode transistor T2. For example, the first node voltage VD1 may be about 1.5V, and the second threshold value VTH2, according the above description, may be about 2.2V.

When the first inverting circuit INV1 outputs the first high voltage VH1, the first high voltage VH1 may substantially equal to the first system voltage Vs1. By configuring the first system voltage Vs1 to be higher than the second threshold value VTH2=VD2+VP2 (i.e., Vs1>VTH2 (VTH2=VD2+VP2)), the second depletion mode transistor T2 may be turned on, such that the second low voltage VL2 may be output at the first terminal of the second depletion mode transistor T2. For example, the first system voltage Vs1 may be about 9V, and the second threshold value VTH2, according to the above description, may be about 2.2V.

In the embodiment shown in FIG. 2, the third inverting circuit INV3 may include a third current limiting transistor TG3, a third load transistor TL3, and a third depletion mode transistor T3. The arrangement and purpose of the third current limiting transistor TG3 and/or the third load transistor TL3 in the third inverting circuit INV3 may be similar to those of the first current limiting transistor TG1 and/or the first load transistor TL1 in the first inverting circuit INV1, respectively, and may be not discussed in detail. Nevertheless, differences may be described as below.

A first terminal of the third current limiting transistor TG3 may be coupled to the input terminal IN of the logic circuit 100.

A second terminal and a control terminal of the third current limiting transistor TG3 may be coupled together and further coupled to the control terminal of the third depletion mode transistor T3. A first terminal of the third depletion mode transistor T3 may be coupled to the third load transistor TL3. A second terminal of the third depletion mode transistor T3 may be coupled to the second node N2, and a control terminal may be coupled to the second terminal of the third current limiting transistor TG3. A first terminal of the third load transistor TL3 may be configured to receive a third system voltage Vs3. A second terminal and a control terminal of the third load transistor TL3 may be coupled together and further coupled to the first terminal of the third depletion mode transistor T3. That is, the first terminal of the third depletion mode transistor T3 may be configured to receive the third system voltage Vs3 via the third load transistor TL3, and the control terminal of the third depletion mode transistor T3 may be coupled to the input terminal IN of the logic circuit 100 via the third current limiting transistor TG3, so as to receive the input signal $S_{IN}$. In the above embodiment, the first terminal of the third depletion mode transistor T3 may be implemented as an output terminal of the third inverting circuit INV3, and the output terminal of the third inverting circuit INV3 may further be coupled to the second output terminal OUT2 of the logic circuit 100.

In some embodiments, the third current limiting transistor and/or the third load transistor TL3 may be depletion mode transistors.

In the above embodiment, the third depletion mode transistor T3 may have a third threshold voltage VP3, such as a pinch off voltage with a negative value. Specifically, as for the third depletion mode transistor T3, when a difference between a voltage VG3 at the control terminal and a voltage at the second terminal (e.g., the second node voltage VD2 shown in FIG. 2), for example, the result of the voltage VG3 at the control terminal minus the second node voltage VD2, is larger than the third threshold voltage VP3, the third depletion mode transistor T3 may be turned on, such that a third low voltage VL3 may be output at the first terminal of the third depletion mode transistor T3. That is, the third inverting circuit INV3 may output the third low voltage VL3. When the difference between the voltage VG3 at the control terminal and the voltage at the second terminal (e.g., the second node voltage VD2 shown in FIG. 2) is smaller than or equal to the third threshold voltage VP3, the third depletion mode transistor T3 may be turned off, such that a third high voltage VH3 may be output at the first terminal of the third depletion mode transistor T3. That is, the third inverting circuit INV3 may output the third high voltage VH3. In the above embodiment, the third high voltage VH3 may be higher than the third low voltage VL3.

Specifically, when the third depletion mode transistor T3 is turned off, the third high voltage VH3 may be associated with (e.g., substantially equal to) the third system voltage Vs3. When the third depletion mode transistor T3 is turned on, the third low voltage VL3 may be associated with (e.g., substantially equal to) the second node voltage VD2.

In other words, if VG3−VD2>VP3 (i.e., VG3>VD2+VP3), the third depletion mode transistor T3 may be turned on. If VG3−VD2≤VP3 (i.e., VG3≤VD2+VP3), the third depletion mode transistor T3 may be turned off. Therefore, as for the voltage VG3 at the control terminal of the third depletion mode transistor T3, a third threshold value may be defined as VTH3=VD2+VP3. In some embodiments, the second node voltage VD2 may be a positive voltage, and the third threshold voltage VP3 may be a negative voltage. Further, the absolute value of the second node voltage VD2 may be configured to be greater than the absolute value of the third threshold voltage VP3 (i.e., |VD2|>|VP3|), and the aforementioned third threshold value VTH3=VD2+VP3 may be a positive value. For example, the first node voltage VD1 may be about 1.5V, and the second node voltage VD2 may be about 3V (i.e., VD2=2*VD1). The third threshold voltage VP3 for the third depletion mode transistor T3 may be about −0.8V, and thus the third threshold value VTH3=VD2+VP3 for the voltage VG3 at the control terminal of the third depletion mode transistor T3 may be a positive value of about 2.2V.

In some embodiments, as shown in FIG. 2, the voltage VG3 at the control terminal of the third depletion mode transistor T3 may be associated with (e.g., substantially equal to) the voltage $V_{IN}$ of the input signal $S_{IN}$. In this case, the voltage $V_{IN}$ of the input signal $S_{IN}$ may substantially have a threshold value VTH3=VD2+VP3. Therefore, with consideration of the above context regarding the first threshold value VTH1=VD1+VP1, the voltage $V_{IN}$ of the input signal $S_{IN}$ may substantially have two threshold values, VTH1=VD1+VP1 and VTH3=VD2+VP3. As described above, VD1<VD2. That is, in the case where VP1 is equal to VP3, VTH1<VTH3. In other words, the voltage $V_{IN}$ of the input signal $S_{IN}$ may substantially have a lower threshold value VTH1=VD1+VP1 and an upper threshold value VTH3=VD2+VP3.

Below is a generalized and schematic description of various logic states of the logic circuit 100. Below context may be described based on a presumed scenario where VD1 is about 1.5V, VD2 is about 3V, VP1 to VP3 are all equal to each other and about −0.8V, Vs1 to Vs3 are all equal to each other and about 9V, the voltage $V_{IN}$ of the input signal $S_{IN}$ may be ranged between 0.5V to 2.4V with a frequency of 1 KHz. As described above, the first threshold value VTH1 is about 0.7V, the second threshold value VTH2 is about 2.2V, and the third threshold value is about 2.2V. However, it should be noted that the specific values mentioned herein are merely for schematic purposes, and they are not meant to limit the present invention, nor should they be directed to the exact values as listed. For example, the specific values may also indicate a range of +10% with respect to value of the listed numeral.

In a first logic state, the voltage $V_{IN}$ of the input signal $S_{IN}$ may be at a logic low level (e.g., 0.6V), which may be lower than the first threshold value VTH1. Therefore, the first inverting circuit INV1 may output the first high voltage VH1, and the second inverting circuit INV2 may output the second low voltage VL2. Thus, the first output signal $S_{OUT1}$ at the first output terminal OUT1 may be at a logic low level. Furthermore, the third inverting circuit INV3 may output a third high voltage VH3, and thus the second output signal $S_{OUT2}$ at the second output terminal OUT2 may be at a logic high level.

In a second logic state, the voltage $V_{IN}$ of the input signal $S_{IN}$ may be at a logic high level (e.g., 2.4V), which may be higher than the third threshold value VTH3. Therefore, the first inverting circuit INV1 may output the first low voltage VL1, and the second inverting circuit INV2 may output the second high voltage VH2. Thus, the first output signal $S_{OUT1}$ at the first output terminal OUT1 may be at a logic high level. Furthermore, the third inverting circuit INV3 may output a third low voltage VL3, and thus the second output signal $S_{OUT2}$ at the second output terminal OUT2 may be at a logic low level.

In some other embodiments, a third logic state may be defined as a different logic state other than the first or second logic state. More details regarding various logic states may be further described below with reference to FIG. 5.

In some embodiments, as for the first bias circuit 10, it may further include a first current source transistor TS1 configured to provide a bias current (such as, the first bias current) for the first diode D1, so as to bias the first diode D1 forward. Specifically, the first current source transistor TS1 may include a first terminal, a second terminal and a control terminal. The first terminal is configured to receive a system voltage Vs4. The second terminal and the control terminal may be coupled together and further coupled to the anode of the first diode D1, so as to be configured to provide the bias current. In some embodiments, the first current source transistor TS1 may be a depletion mode transistor.

In some embodiments, as for the second bias circuit 20, the anode of the second diode D2 may be coupled to the second node N2. As shown, the second node N2 may be configured to receive the second system voltage Vs2 via the second inverting circuit INV2 and may also be configured to receive the third system voltage Vs3 via the third inverting circuit INV3. As described above, the second depletion mode transistor T2 of the second inverting circuit INV2 and the third depletion mode transistor T3 of the third inverting circuit INV3 may be alternately turned on, such that the second diode D2 may always obtain a bias current (such as, the second bias current), either from the path of the second inverting circuit INV2 or from the path of the third inverting circuit INV3, and the second diode D2 may thus be biased forward. With at least one of the second and third depletion mode transistors T2, T3 being in ON state, the second bias circuit 20 may thus be provided without a current source transistor for the second diode D2.

Figure 3:
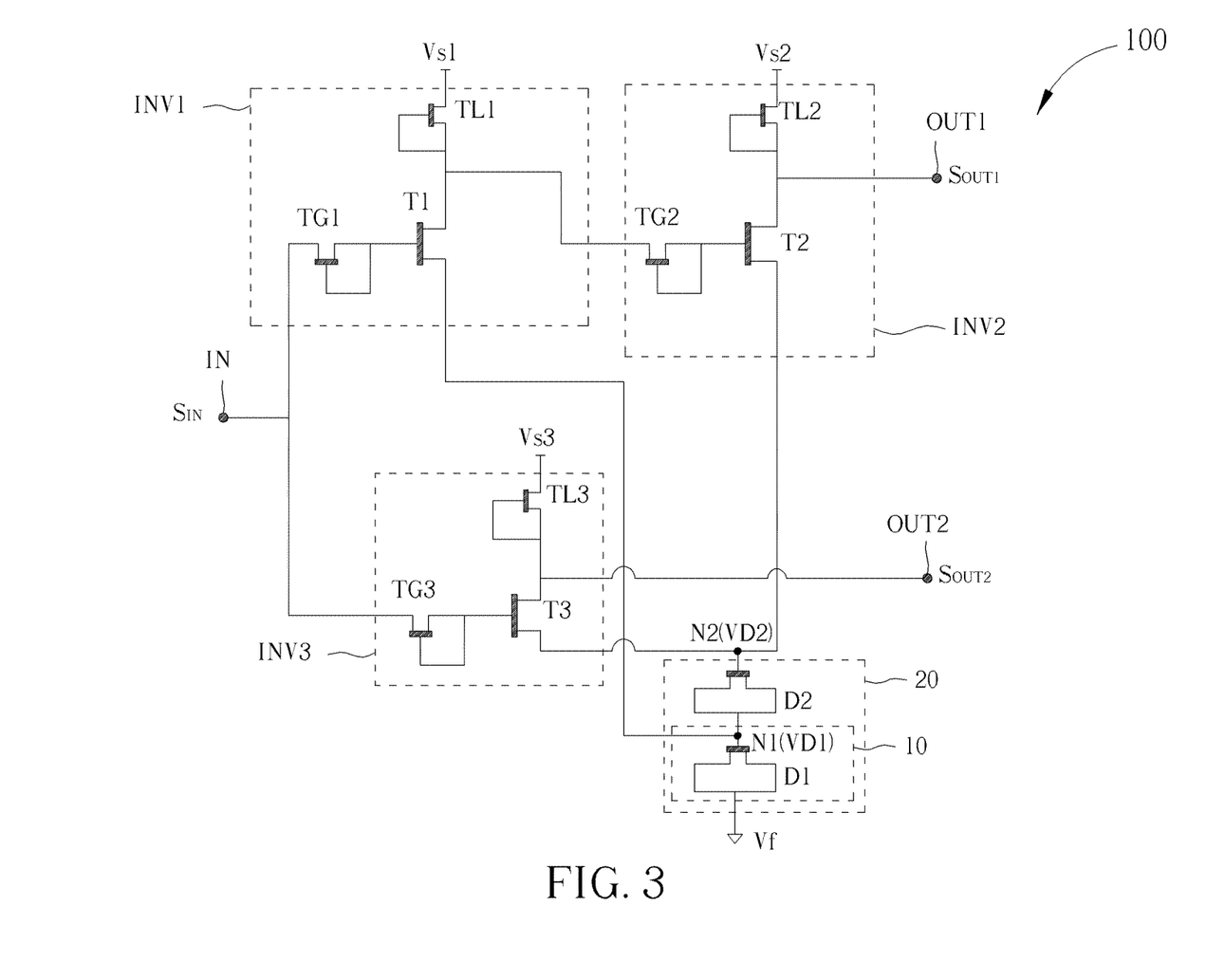

FIG. 3 is a schematic diagram of the logic circuit 100 according to another embodiment of the present invention. FIG. 3 may show similar structures and operations to FIG. 2, and differences may be described as below.

In the embodiment shown in FIG. 3, the first diode D1 of the first bias current 10 and the second diode D2 of the second bias current 20 are respectively depicted to be implemented by transistors, such as at least one depletion mode transistor. In such cases, the control terminal (e.g., gate) of a transistor may be used as the anode of a diode. The first terminal and the second terminal of a transistor may be coupled together to function as the cathode of a diode. Thus, a diode associated with the Schottky junction of a depletion mode transistor may be formed. Furthermore, the first bias circuit 10 and the second bias circuit 20 may share at least one diode.

Specifically, as described above, the quantity of the second diodes D2 of the second bias circuit 20 may be greater than the quantity of the first diodes D1 of the first bias circuit 10. Therefore, at least one of the plurality of second diodes D2 may be used as a first diode D1. As shown, the first node N1 may be coupled between the reference voltage terminal Vf and the second node N2. The diodes located between the reference voltage terminal Vf and the first node N1 may be used as the first diodes D1 of the first bias circuit 10, and the diodes located between the reference voltage terminal Vf and the second node N2 may be used as the second diode D2 of the second bias circuit 20. In such embodiments, the first current source transistor TS1 of the first bias circuit 10 may be also be omitted.

In the above embodiment, the first system voltage Vs1, the second system voltage Vs2 and the third system voltage Vs3 may be different system voltages, respectively; or, in other embodiments, may be a same system voltage.

Figure 4:
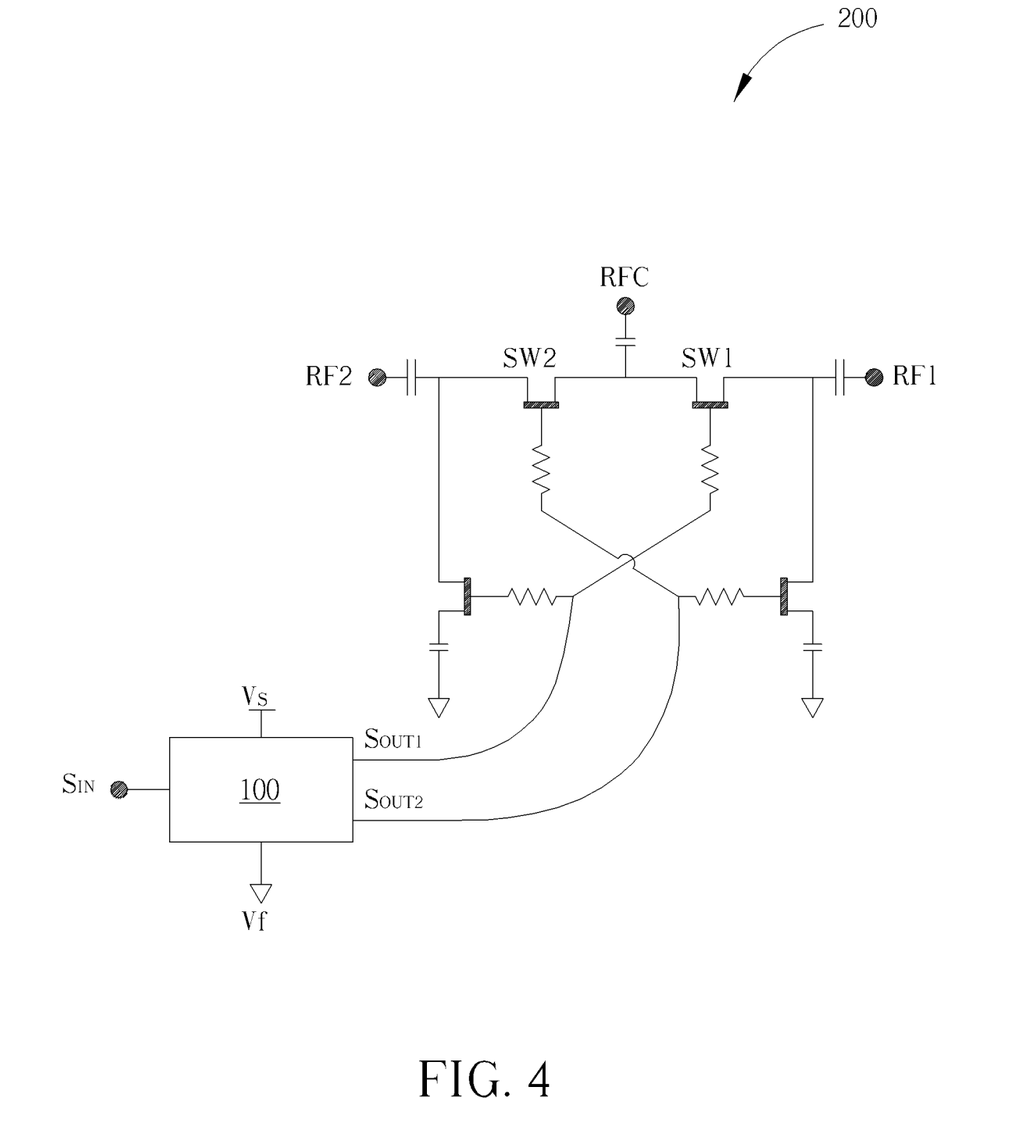
FIG. 4 is a schematic diagram of a front end module according to an embodiment of the present invention.

FIG. 4 is a schematic diagram of a front end module 200 according to embodiments of the present invention. In some embodiments, the front end module 200 may include the logic circuit 100, at least one first switch SW1, and at least one second switch SW2. For example, the first switch SW1 may be coupled to a first signal path between the ports RFC and RF1, and the second switch SW2 may be coupled to a second signal path between the ports RFC and RF2.

In some embodiments, the logic circuit 100 may include an input terminal, a first output terminal, and a second output terminal. The input terminal is configured to receive an input signal $S_{IN}$. Depending on the voltage level of the input signal $S_{IN}$, the logic circuit 100 may output a first output signal $S_{OUT1}$ at the first output terminal and/or a second output signal $S_{OUT2}$ at the second output terminal. A control terminal of the first switch SW1 may be coupled to the first output terminal of the logic circuit 100 to receive the first output signal $S_{OUT1}$, and the first switch SW1 may thus be selectively turned on or turned off based on the first output signal $S_{OUT1}$. A control terminal of the second switch SW2 may be coupled to the second output terminal of the logic circuit 100 to receive the second output signal $S_{OUT2}$, and the second switch SW2 may thus be selectively turned on or turned off based on the second output signal $S_{OUT2}$.

For example, if the first output signal $S_{OUT1}$ is at a logic high and the second output signal $S_{OUT2}$ is at a logic low, the first switch SW1 may be turned on and the second switch SW2 may be turned off. In such a case, the first signal path may be turned on and the second signal path may be turned off. On the other hand, if the first output signal $S_{OUT1}$ is at a logic low and the second output signal $S_{OUT2}$ is at a logic high, the first switch SW1 may be turned off and the second switch SW2 may be turned on. In such a case, the first signal path may be turned off and the second signal path may be turned on.

Figure 5:
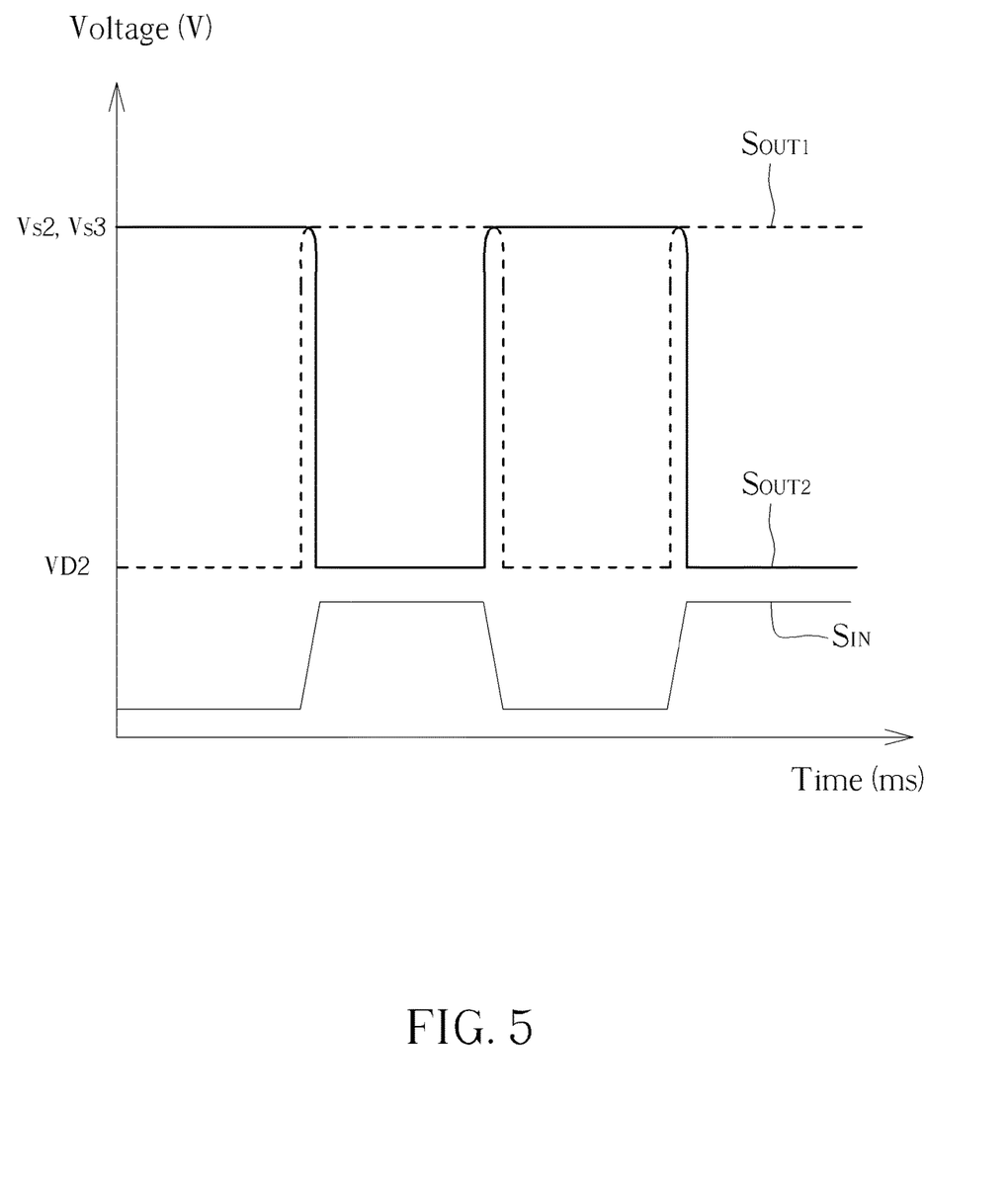
FIG. 5 is a schematic diagram of a logic state of a logic circuit according to an embodiment of the present invention.

FIG. 5 is a schematic diagram of a logic state of a logic circuit according to an embodiment of the present invention. In FIG. 5, the vertical axis represents voltage, the horizontal axis represents time, the curve marked $S_{IN}$ represents a waveform of the input signal of the logic circuit 100, the curve marked $S_{OUT1}$ represents a waveform of the first output signal, and the curve marked $S_{OUT2}$ represents a waveform of the second output signal. As shown, when the input signal $S_{IN}$ is at a logic low, the first output signal $S_{OUT1}$ is at a logic low and the second output signal $S_{OUT2}$ is at a logic high. When the input signal $S_{IN}$ is at a logic high, the first output signal Sour is at a logic high and the second output signal $S_{OUT2}$ is at a logic low.

At least one embodiment of the present invention may provide a logic circuit, which may be substantially implemented by a plurality of depletion mode transistors. In the logic circuit, a depletion mode transistor may be controlled by using a positive voltage applied to the control terminal thereof so as to achieve various logical states of the logic circuit. With a positive voltage, instead of a negative voltage, at the control terminal, a depletion mode transistor may thus be controlled more conveniently. Further, in conventional cases where diodes are provided, a current source may be additionally required for biasing the diodes forward. However, in the present disclosure, different bias circuits may share at least one diode, and with the configuration described above in one embodiment, one or more current sources may be omitted, with its function achieved by other components or circuits. Therefore, circuit complexity and circuit costs may be reduced, and/or circuit operability may be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A logic circuit, comprising:
an input terminal configured to receive an input signal;
a first output terminal configured to output a first output signal;
a second output terminal configured to output a second output signal;
a first inverting circuit coupled between the input terminal and the first output terminal, and comprising a first depletion mode transistor, wherein the first depletion mode transistor comprises:
a first terminal;
a second terminal coupled to a first node; and
a control terminal coupled to the input terminal;
a second inverting circuit coupled between the first inverting circuit and the first output terminal, and comprising a second depletion mode transistor, wherein the second depletion mode transistor comprises:
a first terminal coupled to the first output terminal;
a second terminal coupled to a second node; and
a control terminal coupled to the first terminal of the first depletion mode transistor; and
a third inverting circuit coupled between the input terminal and the second output terminal;
wherein a first node voltage at the first node is lower than a second node voltage at the second node.

2. The logic circuit of claim 1, further comprising:
a first bias circuit disposed between a first reference voltage terminal and the first node, and configured to provide the first node voltage at the first node, the first bias circuit comprising a first resistor and/or a first diode;
a second bias circuit disposed between a second reference voltage terminal and the second node, and configured to provide the second node voltage at the second node, the second bias circuit comprising a second resistor and/or a second diode.

3. The logic circuit of claim 2, wherein:
the first depletion mode transistor has a first threshold voltage, and an absolute value of the first node voltage is larger than an absolute value of the first threshold voltage; and
the first bias circuit comprises at least one first diode with an anode of the at least one first diode coupled to the first node and a cathode of the at least one first diode coupled to the first reference voltage terminal.

4. The logic circuit of claim 3, wherein:
the first depletion mode transistor is turned off when a result of a voltage at the control terminal of the first depletion mode transistor minus the first node voltage is smaller or equal to the first threshold voltage, such that the first inverting circuit outputs a first high voltage;

the first depletion mode transistor is turned on when the result of the voltage at the control terminal of the first depletion mode transistor minus the first node voltage is larger than the first threshold voltage, such that the first inverting circuit outputs a first low voltage; and the first high voltage is higher than the first low voltage.

5. The logic circuit of claim 4, wherein:
the first terminal of the first depletion mode transistor is configured to receive a first system voltage; and
the first high voltage is substantially equal to the first system voltage, and the first low voltage is substantially equal to the first node voltage.

6. The logic circuit of claim 5, wherein:
the first inverting circuit further comprises a first load transistor; and
the first terminal of the first depletion mode transistor is configured to receive the first system voltage via the first load transistor.

7. The logic circuit of claim 6, wherein the first load transistor is a depletion mode transistor.

8. The logic circuit of claim 2, wherein:
the second depletion mode transistor has a second threshold voltage, and an absolute value of the second node voltage is larger than an absolute value of the second threshold voltage; and
the second bias circuit comprises at least one second diode with an anode of the at least one second diode coupled to the second node and a cathode of the at least one second diode coupled to the second reference voltage terminal.

9. The logic circuit of claim 8, wherein:
the second depletion mode transistor is turned off when a result of a voltage at the control terminal of the second depletion mode transistor minus the second node voltage is smaller or equal to the second threshold voltage, such that the second inverting circuit outputs a second high voltage;
the second depletion mode transistor is turned on when the result of the voltage at the control terminal of the second depletion mode transistor minus the second node voltage is larger than the second threshold voltage, such that the second inverting circuit outputs a second low voltage; and
the second high voltage is higher than the second low voltage.

10. The logic circuit of claim 9, wherein:
the first terminal of the second depletion mode transistor is configured to receive a second system voltage; and
the second high voltage is substantially equal to the second system voltage, and the second low voltage is substantially equal to the second node voltage.

11. The logic circuit of claim 10, wherein:
the second inverting circuit further comprises a second load transistor; and
the first terminal of the second depletion mode transistor is configured to receive the second system voltage via the second load transistor.

12. The logic circuit of claim 11, wherein the second load transistor is a depletion mode transistor.

13. The logic circuit of claim 1, wherein:
the third inverting circuit comprises a third depletion mode transistor, and the third depletion mode transistor has a third threshold voltage; and the third depletion mode transistor comprises:
a first terminal coupled to the second output terminal;
a second terminal coupled to the second node; and
a control terminal coupled to the input terminal.

14. The logic circuit of claim 13, wherein:
the third depletion mode transistor is turned off when a result of a voltage at the control terminal of the third depletion mode transistor minus the second node voltage is smaller or equal to the third threshold voltage, such that the third inverting circuit outputs a third high voltage;
the third depletion mode transistor is turned on when the result of the voltage at the control terminal of the third depletion mode transistor minus the second node voltage is larger than the third threshold voltage, such that the third inverting circuit outputs a third low voltage; and
the third high voltage is higher than the third low voltage.

15. The logic circuit of claim 14, wherein:
the first terminal of the third depletion mode transistor is configured to receive a third system voltage; and
the third high voltage is substantially equal to the third system voltage, and the third low voltage is substantially equal to the second node voltage.

16. The logic circuit of claim 15, wherein:
the third inverting circuit further comprises a third load transistor; and
the first terminal of the third depletion mode transistor is configured to receive the third system voltage via the third load transistor.

17. The logic circuit of claim 16, wherein the third load transistor is a depletion mode transistor.

18. The logic circuit of claim 2, wherein:
the first bias circuit comprises m first diodes coupled in series;
the second bias circuit comprises n second diodes coupled in series; and
m and n are positive integers, and n is greater than m.

19. The logic circuit of claim 3, wherein the first bias circuit further comprises a first current source transistor configured to provide a first bias current for the first diode.

20. The logic circuit of claim 2, wherein:
the first reference voltage terminal and the second reference voltage terminal are a same reference voltage terminal; and
the first node is disposed between the second node and the second reference voltage terminal.

21. A front end module, comprising:
a logic circuit comprising:
an input terminal configured to receive an input signal;
a first output terminal configured to output a first output signal;
a second output terminal configured to output a second output signal;
a first inverting circuit coupled between the input terminal and the first output terminal, and comprising a first depletion mode transistor, wherein the first depletion mode transistor comprises:
a first terminal;
a second terminal coupled to a first node; and
a control terminal coupled to the input terminal;
a second inverting circuit coupled between the first inverting circuit and the first output terminal, and comprising a second depletion mode transistor, wherein the second depletion mode transistor comprises:
a first terminal coupled to the first output terminal;
a second terminal coupled to a second node; and a control terminal coupled to the first terminal of the first depletion mode transistor; and a third inverting circuit coupled between the input terminal and the second output terminal, a first node voltage of the first node being lower than a second node voltage of the second node;

a first switch coupled to the first output terminal of the logic circuit, and configured to be turned on or turned off according to the first output signal; and a second switch coupled to the second output terminal of the logic circuit, and configured to be turned on or turned off according to the second output signal.

22. A logic circuit, comprising:

an input terminal configured to receive an input signal;

a first output terminal configured to output a first output signal;

a second output terminal configured to output a second output signal;

a first inverting circuit coupled between the input terminal and the first output terminal, and comprising a first depletion mode transistor, wherein the first depletion mode transistor comprises:

a first terminal;

a second terminal coupled to a first node; and a control terminal coupled to the input terminal;

a second inverting circuit coupled between the first inverting circuit and the first output terminal, and comprising a second depletion mode transistor, wherein the second depletion mode transistor comprises:

a first terminal coupled to the first output terminal;

a second terminal coupled to a second node; and a control terminal coupled to the first terminal of the first depletion mode transistor;

a third inverting circuit coupled between the input terminal and the second output terminal, and comprising a third depletion mode transistor, wherein the third depletion mode transistor comprises:

a first terminal coupled to the second output terminal;

a second terminal coupled to the second node; and a control terminal coupled to the input terminal; and a bias circuit coupled between a reference voltage terminal and the second node, and configured to provide a node voltage at the second node.

\* \* \* \* \*